(12) United States Patent
Chen et al.

(10) Patent No.: US 12,426,186 B2
(45) Date of Patent: Sep. 23, 2025

(54) VEHICLE DISPLAY APPARATUS

(71) Applicant: TPK Auto Tech (Xiamen) Limited, Fujian (CN)

(72) Inventors: Shih Hao Chen, Hsinchu County (TW); Xiao Xia You, Jianyang (CN); Xiao Qin Lin, Zhangpu County (CN); Cong Xiao, Xiamen (CN)

(73) Assignee: TPK Auto Tech (Xiamen) Limited, Xiamen (CN)

( * ) Notice: Subject to any disclaimer, the term of this patent is extended or adjusted under 35 U.S.C. 154(b) by 167 days.

(21) Appl. No.: 18/544,553

(22) Filed: Dec. 19, 2023

(65) Prior Publication Data
US 2025/0133673 A1     Apr. 24, 2025

(30) Foreign Application Priority Data

Oct. 23, 2023   (CN) ......................... 202311377336.5

(51) Int. Cl.
*H05K 5/03*        (2006.01)
(52) U.S. Cl.
CPC ....................................... *H05K 5/03* (2013.01)
(58) Field of Classification Search
None
See application file for complete search history.

(56) References Cited

U.S. PATENT DOCUMENTS

| | | | | |
|---|---|---|---|---|
| 2020/0409205 A1* | 12/2020 | Zhou | ................. | G02F 1/133322 |
| 2021/0063817 A1* | 3/2021 | Jin | ..................... | G02F 1/133606 |
| 2022/0171117 A1* | 6/2022 | An | ........................ | G02B 6/0088 |
| 2022/0183171 A1* | 6/2022 | Basquin | ............. | B32B 37/1284 |
| 2022/0305914 A1* | 9/2022 | Vogt | ........................ | B60K 35/22 |

* cited by examiner

*Primary Examiner* — Xanthia C Relford
*Assistant Examiner* — Xanthia C Cunningham
(74) *Attorney, Agent, or Firm* — Cooper Legal Group, LLC

(57) ABSTRACT

A vehicle display apparatus includes a cover plate, a display module, a frameless backlight module, a housing, a main circuit board, and a mounting bracket. The display module has a cable located in a non-visible area. The frameless backlight module is disposed on a side of the display module away from the cover plate. The housing includes a side wall, a first step, and a second step. The side wall laterally covers the cover plate. The first step supports the cover plate. The first step has a through hole. The second step supports the frameless backlight module. The main circuit board is disposed on a back surface of the housing. The cable is connected to the main circuit board through the through hole. The mounting bracket covers the main circuit board. The side wall laterally covers a connecting portion between the mounting bracket and the housing.

10 Claims, 3 Drawing Sheets

VEHICLE DISPLAY APPARATUS

CROSS-REFERENCE TO RELATED APPLICATION

The instant application claims priority to Chinese Patent Application 202311377336.5, filed Oct. 23, 2023, which is incorporated herein by reference.

FIELD OF DISCLOSURE

The present disclosure relates to a display apparatus, especially a vehicle display apparatus.

DESCRIPTION OF RELATED ART

Vehicle display apparatuses are devices for displaying information in vehicles, for example, instrument panels, central consoles, and entertainment systems. An instrument panel is usually for displaying the vehicle speed, speed of rotation, fuel level, and other important information. A central console is usually for controlling the stereo, air conditioner, and other functions. An entertainment system can play music, videos, and games. A vehicle display apparatus provides the driver with needed information and enables a safer and more comfortable vehicle. Therefore, as technology progresses, the vehicle display apparatus becomes more and more important as a component of a vehicle.

In addition, narrower bezels and thinned-down cases are two important trends of vehicle display apparatus development. The narrow bezel can make the display appear sizeable and more attractive. Thinning down the case allows the vehicle display apparatus to fit into a smaller space and makes the installation within the vehicle easier. Nevertheless, there is currently no simple and effective solution available for narrowing the bezel and thinning down the case.

Therefore, introducing a solution that can solve the aforementioned problems of the vehicle display apparatuses is what the industry has been focusing on with research and development resources and intends to achieve.

SUMMARY

In view of this, one objective of the present disclosure is to disclose a type of vehicle display apparatus that can solve the aforementioned problems.

To achieve the aforementioned objective, based on an embodiment of the present disclosure, a vehicle display apparatus comprises a cover plate, a display module, a frameless backlight module, a housing, a main circuit board, and a mounting bracket. The cover plate has a visible area and a non-visible area surrounding the visible area. The display module is at least partially located in the non-visible area and has a cable located in the non-visible area. The frameless backlight module is disposed on a side of the display module away from the cover plate. The housing comprises a side wall, a first step, and a second step. The side wall laterally covers the cover plate. The first step is connected to an inner side of the side wall and supports the cover plate. The first step has a through hole. The second step is connected to an inner side of the first step and supports the frameless backlight module. The main circuit board is disposed on a back surface of the housing. The cable is connected to the main circuit board through the through hole. The mounting bracket covers the main circuit board. The side wall laterally covers a connecting portion between the mounting bracket and the housing.

In one or more embodiments of the present disclosure, the mounting bracket further covers an opening of the through hole located on the back surface of the housing.

In one or more embodiments of the present disclosure, a bottom surface of the side wall and a bottom surface of the first step are located on the back surface of the housing. The bottom surface of the first step is recessed compared to the bottom surface of the side wall. The connecting portion is located on the bottom surface of the first step.

In one or more embodiments of the present disclosure, the through hole penetrates through a top surface and a bottom surface of the first step.

In one or more embodiments of the present disclosure, a top surface of the second step is recessed compared to a top surface of the first step.

In one or more embodiments of the present disclosure, a bottom surface of the first step and a bottom surface of the second step are located on the back surface of the housing. The bottom surface of the first step and the bottom surface of the second step are aligned on a same level and are at least partially covered by the mounting bracket.

In one or more embodiments of the present disclosure, one side of the housing that faces the cover plate forms an accommodation space. The cover plate, the display module, and the frameless backlight module are situated in the accommodation space.

In one or more embodiments of the present disclosure, the second step comprises a first supporting portion and a second supporting portion. The first supporting portion is connected to the inner side of the first step and supports the display module. The second supporting portion is connected with the first supporting portion and supports the frameless backlight module.

In one or more embodiments of the present disclosure, the vehicle display apparatus further comprises a frame. The frame is disposed on the first supporting portion. The display module is supported by the first supporting portion through the frame.

In one or more embodiments of the present disclosure, a distance between the through hole and the inner side of the first step is greater than zero.

In summary, in the vehicle display apparatus of the present disclosure, the cover plate, the display module, and the frameless backlight module are mounted in the accommodation space of the single integrated piece of housing, thus effectively reducing the overall width and thickness of the vehicle display apparatus. By having the main circuit board deposed on the back surface of the housing (that is, outside the accommodation space) and connecting the cable of the display module with the main circuit board through the housing, the overall thickness of the vehicle display apparatus can be further reduced. The mounting bracket that covers the back surface of the housing can achieve the objective of keeping the main circuit board and the cable hidden.

The aforementioned statements are only used to explain problems that can be solved by the present disclosure, the technical means for solving the problems, and the effect thereof. The details of the present disclosure will become further understood from the following descriptions regarding the way of embodiments and related drawings.

BRIEF DESCRIPTION OF THE DRAWINGS

To enable a better understanding of the aforementioned and other objectives, novel features, advantages, and embodiments of the present disclosure, the following drawings are provided.

DETAILED DESCRIPTION

Figure 1:
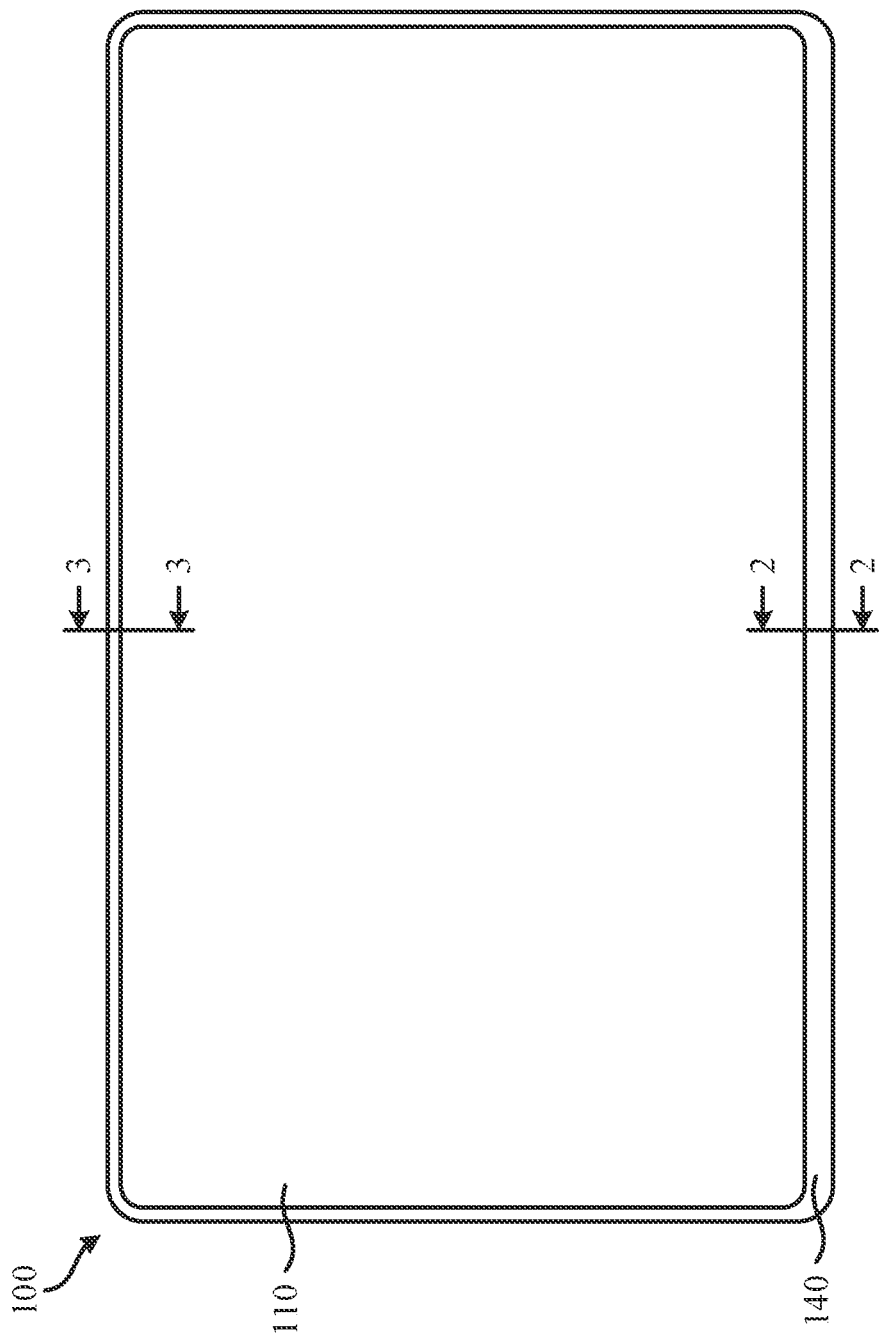
FIG. 1 is a schematic diagram of the front view of an embodiment of the vehicle display apparatus of the present disclosure.

A plurality of embodiments of the present disclosure will be disclosed below through drawings. For the purpose of clear explanation, many details in practice will be provided together with the following descriptions. However, these detailed descriptions in practice shall not be interpreted as limits of the scope, applicability, or configuration of the present disclosure in any way. That is, in some embodiments of the present disclosure, these details in practice are not required. Furthermore, to simplify the drawings, some conventional structures and components in the art shown in the drawings will be illustrated schematically.

Figure 2:
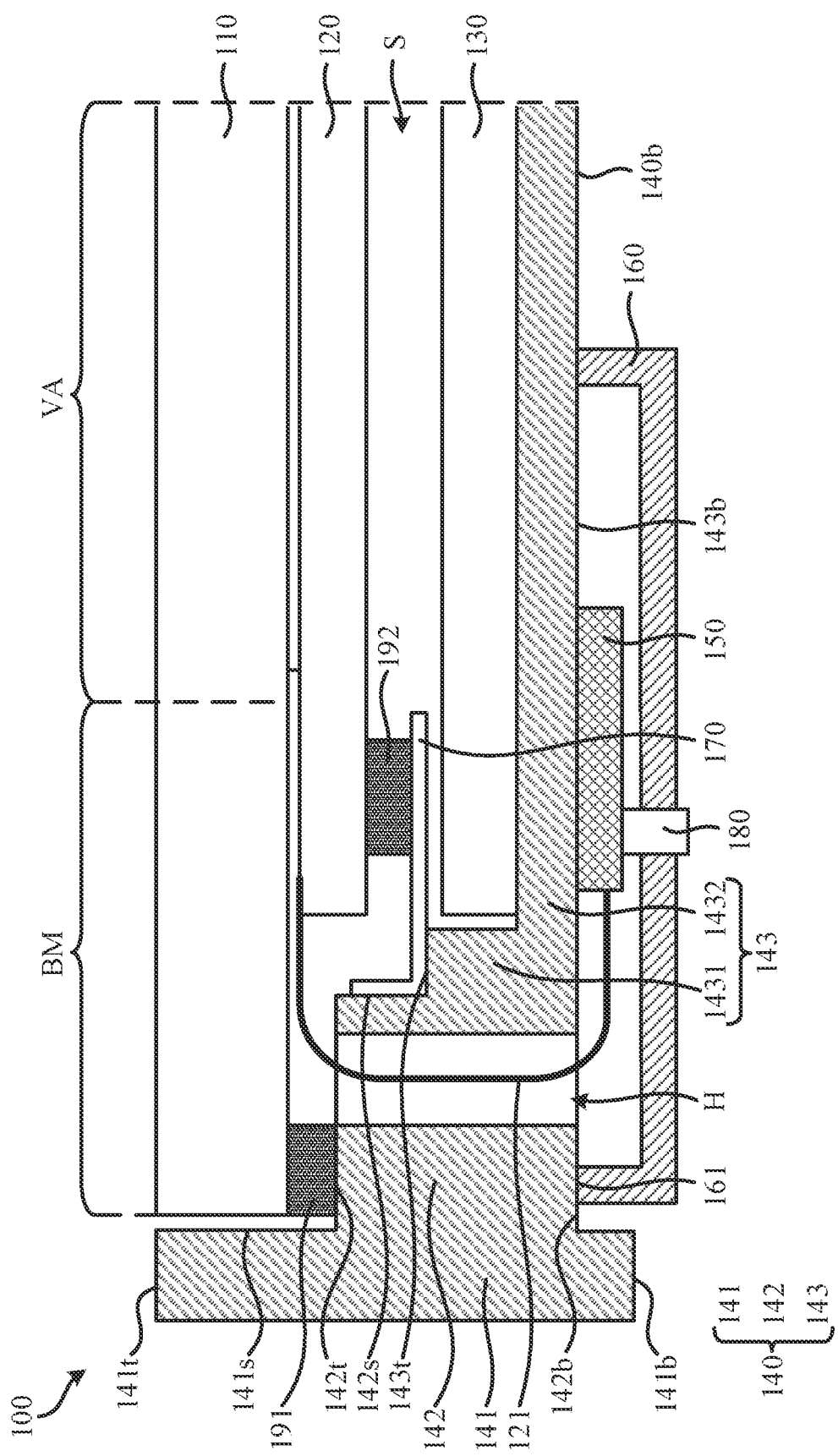
FIG. 2 is a partial cross-sectional schematic diagram of the vehicle display apparatus described in FIG. 1 along the 2-2 cutting plane line.
Figure 3:
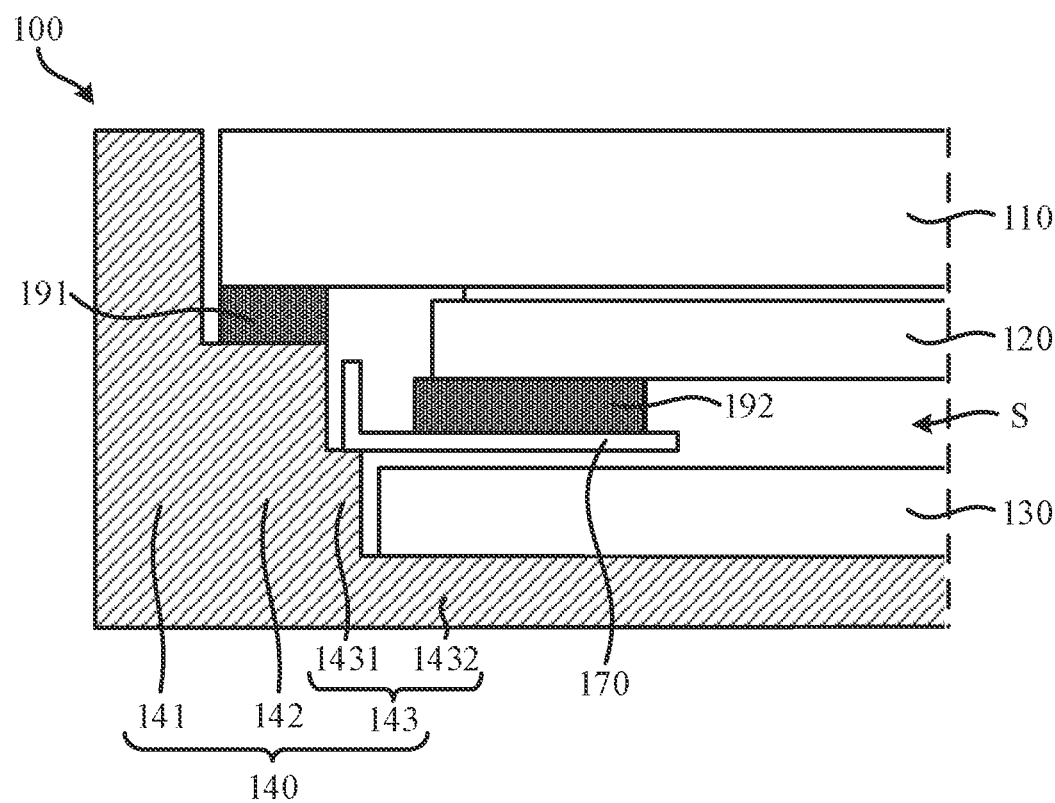
FIG. 3 is a partial cross-sectional schematic diagram of the vehicle display apparatus described in FIG. 1 along the 3-3 cutting plane line.

Please refer to FIG. 1, FIG. 2, and FIG. 3. FIG. 1 illustrates the front view the vehicle display apparatus 100 of an embodiment of the present disclosure; FIG. 2 illustrates a partial cross-sectional view of the vehicle display apparatus 100 of FIG. 1 along the 2-2 cutting plane line; FIG. 3 illustrates a partial cross-sectional view of the vehicle display apparatus 100 of FIG. 1 along the 3-3 cutting plane line. As shown in FIG. 1 to FIG. 3, in the embodiments of the present disclosure, the vehicle display apparatus 100 comprises a cover plate 110, a display module 120, a frameless backlight module 130, and a housing 140. The cover plate 110 has a visible area (VA) and a non-visible area (BM) surrounding the visible area (VA). For example, the bottom of the cover plate 110 can be set with a light shading layer (not illustrated in the figure). The area on the cover plate 110 corresponding to the area covered by the light shading layer is the non-visible area (BM); whereas the area on the cover plate 110 corresponding to the area not covered by the light shading layer is the visible area (VA).

The display module 120 is at least partially located in the non-visible area (BM), and has a cable 121 located in the non-visible area (BM). For example, the cable 121 is a flexible printed circuit, and the display module 120 of the embodiment is a liquid-crystal display (LCD) using Film on Glass (FOG) technique, but the present disclosure is not limited to such a configuration. The frameless backlight module 130 is disposed on a side of the display module 120 away from the cover plate 110. For instance, the frameless backlight module 130 comprises a light source, a light guide panel, and at least an optical film (not illustrated in the figure), details of which are omitted in the presented figures.

One side of the housing 140 that faces the cover plate 110 forms an accommodation space S. The cover plate 110, the display module 120, and the frameless backlight module 130 are situated in the accommodation space S of the single integrated piece of housing 140.

As shown in FIG. 2, the housing 140 comprises a side wall 141, a first step 142, and a second step 143. The first step 142 is connected to an inner side 141s of the side wall 141 and supports the cover plate 110. In other words, the side wall 141 and the first step 142 jointly form a supporting portion of the cover plate 110. The second step 143 is connected to an inner side 142s of the first step 142 and supports the frameless backlight module 130. Since the frameless backlight module 130 is directly supported at the second step 143, the frameless backlight module 130, the cover plate 110, and the display module 120 share the housing 140 together.

To explain in detail, as shown in FIG. 2, in the embodiment, the first step 142 of the housing 140 has a through hole H. The through hole H penetrates through the top surface 142t and the bottom surface 142b of the first step 142. The vehicle display apparatus 100 further comprises a main circuit board 150 and a mounting bracket 160. The main circuit board 150 is disposed on a back surface 140b of the housing 140. In other words, the main circuit board 150 is disposed outside the accommodation space S of the housing 140. The cable 121 passes through the through hole H of the first step 142 and is connected to the main circuit board 150. The mounting bracket 160 covers the main circuit board 150 and also covers the opening of the through hole H on the back surface 140b of the housing 140.

According to the aforementioned structural configuration, having the main circuit board 150 disposed outside the housing 140 can effectively reduce the overall thickness of the vehicle display apparatus 100. The mounting bracket 160 that covers the back surface 140b of the housing 140 can achieve the objective of keeping the main circuit board 150 and the cable 121 hidden.

In the embodiment shown in FIG. 2, the distance between the through hole H and the inner side 142s of the first step 142 is greater than zero. In other words, the through hole H is not perforated directly on the surface of the inner side 142s of the first step 142. By doing so, the mechanical strength of the through hole H is ensured. Therefore, the housing 140 will not become deformable with a through hole H perforated on the first step 142.

In an actual application, the back surface 140b of the housing 140 can constitute a part of the outer appearance of the vehicle display apparatus 100. In other words, when the vehicle display apparatus 100 is installed in a vehicle, the back surface 140b of the housing 140 will be partially exposed to the outside.

In some embodiments, when the vehicle display apparatus 100 is installed in a vehicle, the mounting bracket 160 is obscured by the vehicle and not exposed to the outside. Therefore, when determining the overall thickness of the vehicle display apparatus 100 of these embodiments, it can be mainly based on the thickness of the housing 140, without taking into account the thickness of the mounting bracket 160.

In the embodiment shown in FIG. 2, the upper end of the side wall 141 laterally covers the cover plate 110. The lower end of the side wall 141 laterally covers a connecting portion 161 between the mounting bracket 160 and the housing 140. More specifically, the top surface 142t of the first step 142 is recessed compared to the top surface 141t of the side wall 141. Therefore, it can be known that the supporting portion formed by the side wall 141 and the first step 142 together is recessed compared to the top surface 141t of the side wall 141. Also, the bottom surface 141b of the side wall 141 and the bottom surface 142b of the first step 142 are located on the back surface 140b of the housing 140. The bottom surface 142b of the first step 142 is recessed compared to the bottom surface 141b of the side wall 141. The connecting portion 161 between the mounting bracket 160 and the housing 140 is located on the bottom surface 142b of the first step 142. Therefore, the connecting portion 161 between the mounting bracket 160 and the housing 140 is recessed compared to the bottom surface 141b of the side wall 141. The side wall 141 of the housing 140 thus can better protect other elements of the vehicle display apparatus 100 and increase the difficulty of removing the cover plate 110 and the mounting bracket 160 arbitrarily.

In the embodiment shown in FIG. 2, the bottom surface 142b of the first step 142 and the bottom surface 143b of the second step 143 are located on the back surface 140b of the housing 140. The bottom surface 142b of the first step 142 and the bottom surface 143b of the second step 143 are aligned on the same level and are at least partially covered by the mounting bracket 160. In some other embodiments, the bottom surface 142b of the first step 142 and the bottom surface 143b of the second step 143 are not aligned on the same level. For example, the bottom surface 143b of the second step 143 can be recessed compared to the bottom surface 142b of the first step 142. In some other embodiments, at least one of the bottom surface 142b of the first step 142 or the bottom surface 143b of the second step 143 can be a curved surface.

In some embodiments, the main circuit board 150 is disposed on the back surface 140b of the housing 140 by, but not limited to, an adhesive securing means or a lock securing means. In some embodiments, the mounting bracket 160 is disposed on the back surface 140b of the housing 140 by, but not limited to, an adhesive securing means or a lock securing means.

In the embodiment shown in FIG. 2, the cover plate 110 is mounted on the first step 142 of the housing 140 by a fixing piece 191. For example, the fixing piece 191 can be, but is not limited to, double-sided tapes, such as 3M™ VHB™ (very high bond tape).

In the embodiment shown in FIG. 2, the top surface 143t of the second step 143 is recessed compared to the top surface 142t of the first step 142. More specifically, the second step 143 comprises a first supporting portion 1431 and a second supporting portion 1432. The first supporting portion 1431 is connected to the inner side 142s of the first step 142 and supports the display module 120. The second supporting portion 1432 is connected with the first supporting portion 1431 and supports the frameless backlight module 130. Therefore, the second step 143 utilizes the first supporting portion 1431 and the second supporting portion 1432 to support the display module 120 and the frameless backlight module 130 respectively and separately at two different height levels.

The vehicle display apparatus 100 further comprises a frame 170 and a fixing piece 192. The frame 170 is disposed on the first supporting portion 1431. The frame 170 is supported by the first supporting portion 1431 located underneath. The fixing piece 192 is disposed on one side of the frame 170 away from the frameless backlight module 130. The display module 120 is supported by the frame 170 through the fixing piece 192. The display module 120 is thus supported by and sits on the first supporting portion 1431.

In some embodiments, the fixing piece 192 is cell tape to serve as a buffer between the frame 170 and the display module 120, but the disclosure is not limited to cell tape.

In the embodiment shown in FIG. 2, the vehicle display apparatus 100 further comprises an electrical connector 180. The electrical connector 180 is connected to the main circuit board 150, penetrates through the mounting bracket 160, and is exposed. The electrical connector 180 configured to be electrically connected with a vehicle.

In some embodiments, the electrical connector 180 is a high-speed data connector that can transmit data and signals at a 6 GHz frequency without being interfered with by any noise. Such a configuration is extremely suitable for automobile industry applications.

Figure 4:
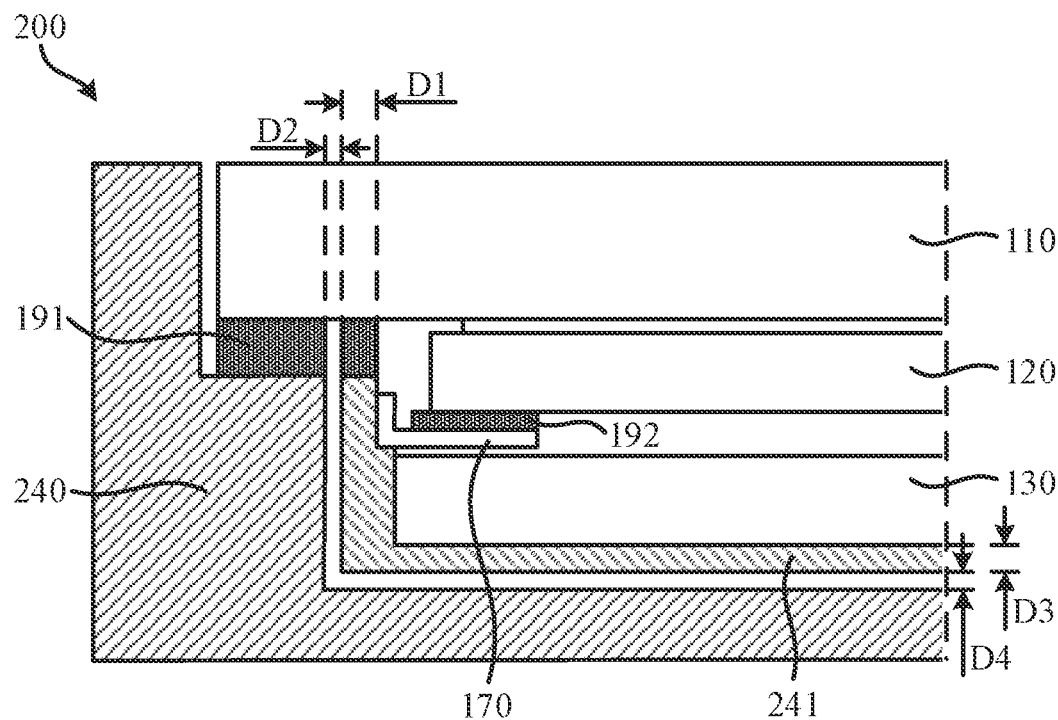
FIG. 4 is a partial cross-sectional schematic diagram of another type of vehicle display apparatus.

Please refer to FIG. 4, a partial cross-sectional schematic diagram of another type of vehicle display apparatus 200 is provided. In the embodiment shown in FIG. 4, the vehicle display apparatus 200 comprises a cover plate 110, a display module 120, a frameless backlight module 130, a housing 240, a frame 170, fixing pieces 191 and 192, and a back frame 241, wherein the cover plate 110, the display module 120, the frameless backlight module 130, and the fixing pieces 191 and 192 are identical or similar to those of the embodiment shown in FIG. 3. Therefore, please refer to the previously provided descriptions for the relevant information of the structures and functions of these components, which will not be repeated here. One explanation to be provided is that the housing 240 and the back frame 241 are used to replace the single integrated piece of housing 140, shown in FIG. 3, in the vehicle display apparatus 200.

More specifically, in the embodiment shown in FIG. 4, the cover plate 110 is disposed on the housing 240 through the fixing piece 191. The display module 120 is disposed on the back frame 241 through the fixing piece 192 and the frame 170. The frameless backlight module 130 is supported by the back frame 241. The back frame 241 is accommodated in the housing 240. In comparing FIG. 3 and FIG. 4, it is apparent that since the vehicle display apparatus 100 in FIG. 3 does not have a back frame 241, the side wall thickness of the back frame 241 (that is, a distance D1) and the lateral gap between the back frame 241 and the housing 240 (that is, a distance D2) in the width direction of the vehicle display apparatus 100 can be reduced, therefore allowing the vehicle display apparatus 100 to achieve the objective of reducing the overall width and providing a narrower bezel. In addition, the thickness of the bottom plate of the back frame 241 (that is, a distance D3) and the vertical gap between the back frame 241 and the housing 240 (that is, a distance D4) in the thickness direction of the vehicle display apparatus 100 can be reduced. Therefore, the vehicle display apparatus 100 can effectively achieve the objective of reducing the overall thickness and thinning the apparatus.

Based on the detailed descriptions of these specific embodiments of the present disclosure, it is apparent that in the vehicle display apparatus 100 of the present disclosure, the cover plate 110, the display module 120, and the frameless backlight module 130 are immobilized within the accommodation space S of the single integrated piece of housing 140; therefore, allowing the overall width and thickness of the vehicle display apparatus 100 to be effectively reduced. By disposing the main circuit board 150 on the back surface 140b of the housing 140 (that is, a location outside the accommodation space S) and having the cable 121 of the display module 120 penetrating the housing 140 to be connected with the main circuit board 150, the overall thickness of the vehicle display apparatus 100 can be further reduced. The mounting bracket 160 that covers the back surface 140b of the housing 140 can achieve the objective of keeping the main circuit board 150 and the cable 121 hidden.

The preferred embodiments above are presented to disclose the present disclosure, but shall not be interpreted as limits of the scope, applicability, or configuration of the present disclosure in any way. Those skilled in the art may use any alternative embodiments that are modified or changed without departing from the spirit and scope of the present disclosure, thus the scope of the claim shall be included in the appended claims.

COMPONENT SYMBOL 100,200: vehicle display apparatus
110: cover plate
120: display module
121: cable
130: frameless backlight module
140,240: housing
140b: back surface
141: side wall
141b,142b,143b: bottom surface
141s,142s: an inner side
142: a first step
141t,142t,143t: top surface
143: a second step
1431: first supporting portion
1432: second supporting portion
150: main circuit board
160: mounting bracket
161: connecting portion
170: frame
180: electrical connector
191,192: fixing piece
241: back frame
VA: visible area
BM: non-visible area
D1,D2,D3,D4: distance
H: through hole
S: accommodation space
2-2,3-3: cutting plane line

What is claimed is:

1. A vehicle display apparatus, comprising:
    a cover plate, having a visible area and a non-visible area surrounding the visible area;
    a display module, at least partially located in the non-visible area and having a cable located in the non-visible area;
    a frameless backlight module, disposed on a side of the display module away from the cover plate;
    a housing, comprising
        a side wall, laterally covering the cover plate;
        a first step, connected to an inner side of the side wall and supporting the cover plate, wherein the first step has a through hole; and
        a second step, connected to an inner side of the first step and supporting the frameless backlight module;
    a main circuit board, disposed on a back surface of the housing, wherein the cable is connected to the main circuit board through the through hole; and
    a mounting bracket, covering the main circuit board, wherein the side wall laterally covers a connecting portion between the mounting bracket and the housing.

2. The vehicle display apparatus as described in claim 1, wherein the mounting bracket further covers an opening of the through hole located on the back surface of the housing.

3. The vehicle display apparatus as described in claim 1, wherein a bottom surface of the side wall and a bottom surface of the first step are located on the back surface of the housing, wherein
    the bottom surface of the first step is recessed compared to the bottom surface of the side wall, and the connecting portion is located on the bottom surface of the first step.

4. The vehicle display apparatus as described in claim 1, wherein the through hole penetrates through a top surface and a bottom surface of the first step.

5. The vehicle display apparatus as described in claim 1, wherein a top surface of the second step is recessed compared to a top surface of the first step.

6. The vehicle display apparatus as described in claim 1, wherein a bottom surface of the first step and a bottom surface of the second step are located on the back surface of the housing, wherein
    the bottom surface of the first step and the bottom surface of the second step are aligned on a same level and are at least partially covered by the mounting bracket.

7. The vehicle display apparatus as described in claim 1, wherein one side of the housing that faces the cover plate forms an accommodation space, and the cover plate, the display module, and the frameless backlight module are situated in the accommodation space.

8. The vehicle display apparatus as described in claim 1, wherein the second step comprises:
    a first supporting portion, connected to the inner side of the first step and supporting the display module, and
    a second supporting portion, connected with the first supporting portion and supporting the frameless backlight module.

9. The vehicle display apparatus as described in claim 8, further comprising a frame, which is disposed on the first supporting portion, and the display module is supported by the first supporting portion through the frame.

10. The vehicle display apparatus as described in claim 1, wherein a distance between the through hole and the inner side of the first step is greater than zero.

* * * * *